(12) United States Patent
Zuo et al.

(10) Patent No.: US 9,508,653 B2
(45) Date of Patent: Nov. 29, 2016

(54) DIE-TRACING IN INTEGRATED CIRCUIT MANUFACTURING AND PACKAGING

(71) Applicant: Taiwan Semiconductor Manufacturing Company, Ltd., Hsin-Chu (TW)

(72) Inventors: Kewei Zuo, Xinbei (TW); Wen-Yao Chang, Hsin-Chu (TW); Chien Rhone Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 135 days.

(21) Appl. No.: 14/030,807

(22) Filed: Sep. 18, 2013

(65) Prior Publication Data

US 2015/0079734 A1 Mar. 19, 2015

(51) Int. Cl.
*H01L 21/66* (2006.01)
*H01L 23/544* (2006.01)
*H01L 21/683* (2006.01)

(52) U.S. Cl.
CPC ......... *H01L 23/544* (2013.01); *H01L 21/6835* (2013.01); *H01L 22/12* (2013.01); *H01L 2223/54406* (2013.01); *H01L 2223/54413* (2013.01); *H01L 2223/54433* (2013.01); *H01L 2223/54473* (2013.01); *H01L 2223/54486* (2013.01); *H01L 2223/54493* (2013.01); *H01L 2924/0002* (2013.01)

(58) Field of Classification Search
CPC ................... H01L 23/544; H01L 223/54486; H01L 223/54493
See application file for complete search history.

(56) References Cited

U.S. PATENT DOCUMENTS

| | | | | |
|---|---|---|---|---|
| 5,461,257 A | * | 10/1995 | Hundt | H01L 23/3677 257/706 |
| 6,078,845 A | * | 6/2000 | Friedman | 700/104 |
| 2007/0284144 A1 | * | 12/2007 | Too et al. | 174/520 |
| 2008/0085572 A1 | * | 4/2008 | Yang | H01L 21/568 438/127 |
| 2008/0156780 A1 | * | 7/2008 | Voronov | B23K 26/0807 219/121.69 |
| 2010/0059203 A1 | * | 3/2010 | Chu | G06F 1/20 165/80.3 |
| 2011/0115057 A1 | * | 5/2011 | Harn | G03F 9/7084 257/620 |
| 2011/0156033 A1 | * | 6/2011 | Bintang et al. | 257/48 |
| 2011/0259951 A1 | * | 10/2011 | Meyerson | H01L 23/544 235/375 |
| 2012/0292744 A1 | * | 11/2012 | Liu | H01L 23/481 257/620 |
| 2014/0017822 A1 | * | 1/2014 | Sakai et al. | 438/15 |
| 2014/0048976 A1 | * | 2/2014 | Carino | B29C 43/58 264/272.14 |

* cited by examiner

*Primary Examiner* — Caleb Henry
*Assistant Examiner* — Mounir Amer
(74) *Attorney, Agent, or Firm* — Slater Matsil, LLP

(57) ABSTRACT

A method includes recording a wafer ID and a location ID of a device die in a database, and bonding the device die over a package substrate, wherein the device die and the package substrate are disposed in a package. A package ID is on the package. A mapping is established to link the wafer ID and the location ID of the device die to the package ID.

20 Claims, 9 Drawing Sheets

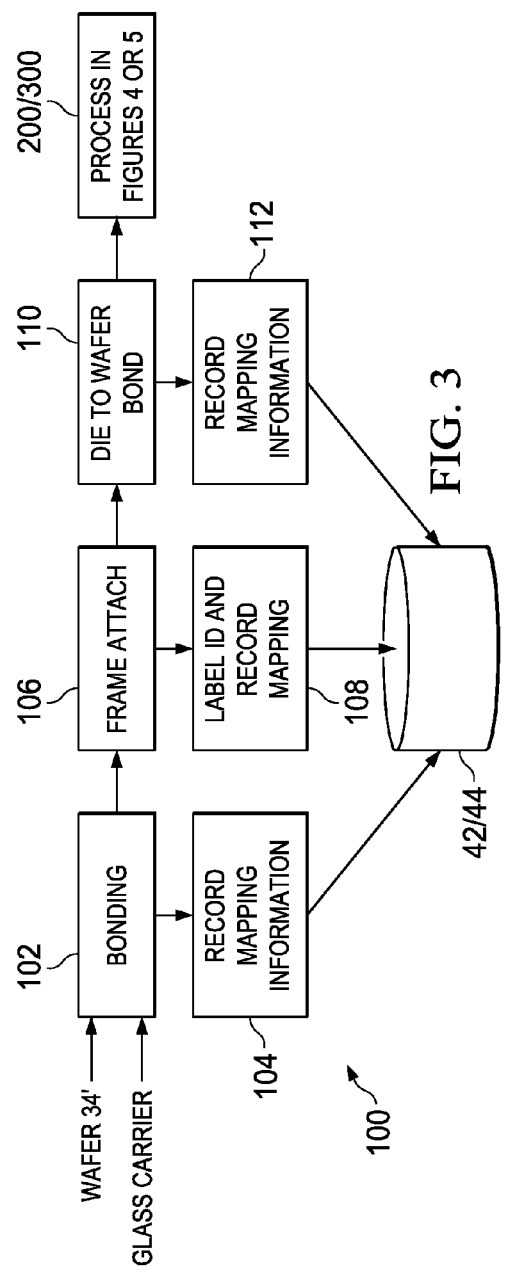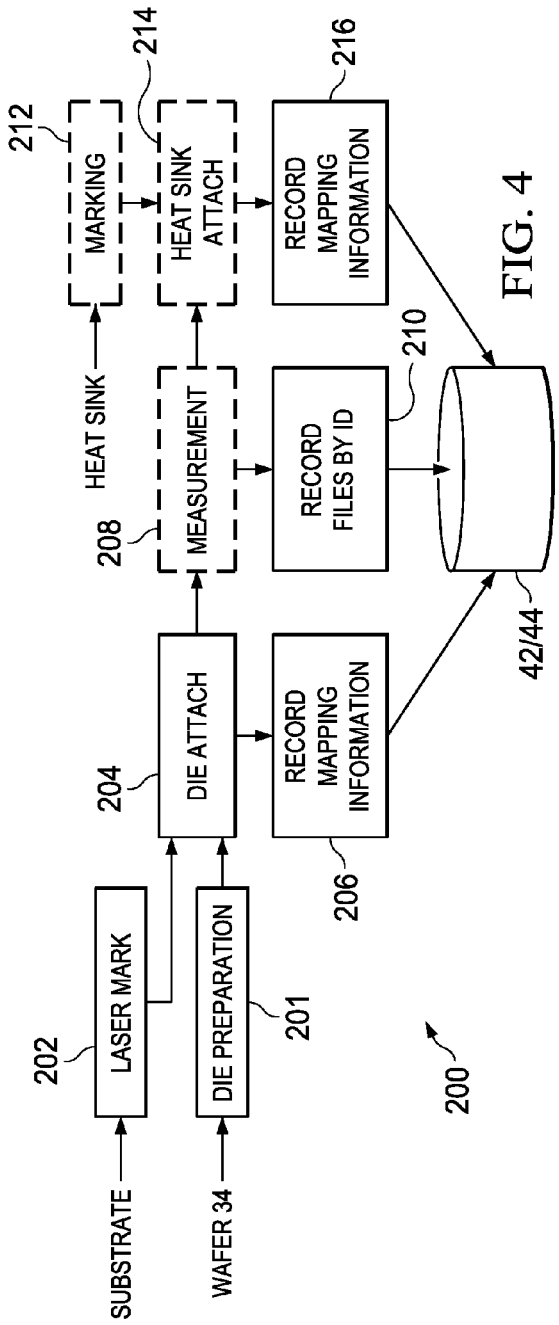

DIE-TRACING IN INTEGRATED CIRCUIT MANUFACTURING AND PACKAGING

BACKGROUND

In the integrated circuit manufacturing processes, production yield is an important factor for foundries. To improve the production yield, it is desirable that when a product fails, the problem in the manufacturing process may be identified. In current manufacturing processes, there is no effective way of tracing problems to the problematic device dies.

BRIEF DESCRIPTION OF THE DRAWINGS

For a more complete understanding of the embodiments, and the advantages thereof, reference is now made to the following descriptions taken in conjunction with the accompanying drawings, in which:

FIG. 3 illustrates a process flow for a die-to-wafer bonding, and the recording of the respective mapping information;

FIGS. 4 and 5 illustrate some exemplary processes for bonding device dies onto package substrates to form packages, and the recording of the respective mapping information;

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A method for tracing the original wafers and the locations of device dies in the wafers is provided in accordance with various exemplary embodiments. The intermediate stages of recording the information for the future tracing are illustrated. The variations of the embodiments are discussed. Throughout the various views and illustrative embodiments, like reference numbers are used to designate like elements. Throughout the description, the term "Identification" (ID) may include digits, letters, patterns, barcodes (including one-dimensional barcodes and two-dimensional (2D) barcodes), and the like, which are designed for recognition. Furthermore, the term "mapping" may refer to a link linking two items that are mapped, so that from one of the linked items, the other one can be found.

Figure 14:
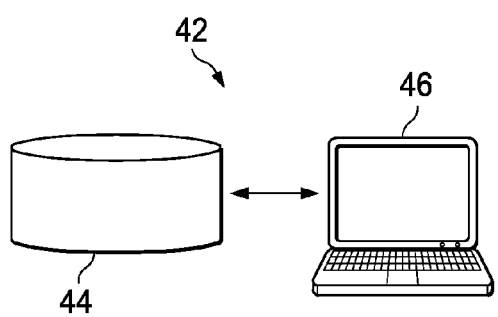
FIG. 14 illustrates a computer and a database for storing mapping information and querying the mapping information.

Referring to FIG. 14, die-tracing system 42 is provided. Die-tracing system 42 may include database 44 for recording package IDs, sequence numbers, location IDs, carrier IDs, and any other information that is used for tracing device dies. The database 44 may include necessary hardware and software, including, for example, tangible storage medium such as hard drives. Furthermore, die-tracing system 42 may include a computer(s) 46 for running the software and accessing database 44.

Figure 1A:
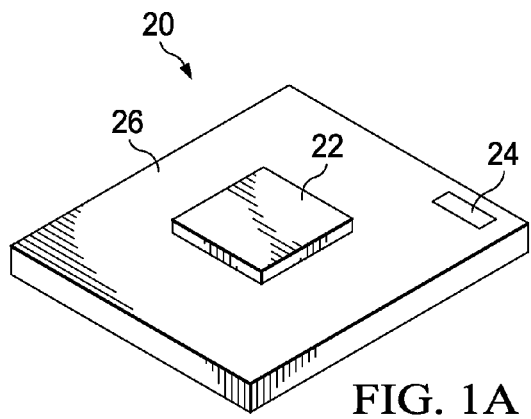
FIGS. 1A, 1B, 1C, and 1D illustrate some exemplary packages and the package Identifications (ID) marked on the packages.
Figure 1B:
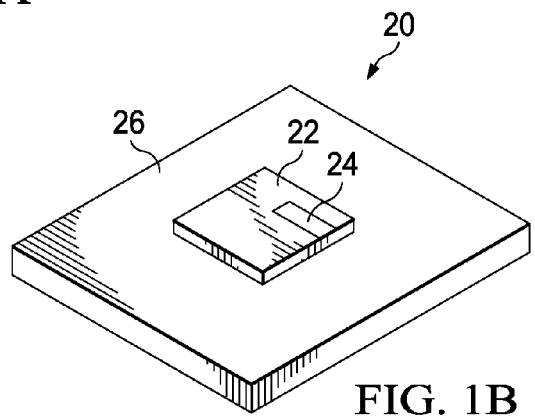

FIGS. 1A, 1B, 1C, and 1D illustrate the marking of packages 20 with package IDs 24. The marking of package ID 24 on the surface of package 20 may include any applicable marking methods including, and not limited to, laser marking, label sticking, ink jetting, and the like. Package 20 may be the final package that has finished the manufacturing and packaging process, and is ready to be assembled, for example, to Printed Circuit Boards (PCB). In accordance with some embodiments, the packages include device dies 22 (FIGS. 1A and 1B). Device dies 22 include integrated circuit devices (not shown) therein, which may include transistors, capacitors, resistors, transformers, and/or the like. Package IDs 24 of a package are marked at an exposed component of package 20, so that if package 20 fails during its operation, the package ID can be identified. For example, referring to FIG. 1A, device die 22 is bonded to another package component 26, which may be a package substrate, an interposer, or the like. Package ID 24 is marked on package component 26. In FIG. 1B, package ID 24 is marked on device die 22. In some embodiments, package ID 24 may use the substrate IDs, heat sink IDs, chip ID, or the like, as long as they are unique. Alternatively, in addition to package ID 24, package substrates may have additional substrate IDs, heat sinks may have additional heat sink IDs, and/or devices dies may have additional die IDs. In these embodiments, one of the respective package substrates, device dies, and/or heat sinks may have two IDs marked on it, with one being the package ID, and the other one being the respective substrate ID, heat sink IDs, or device ID.

Figure 1C:
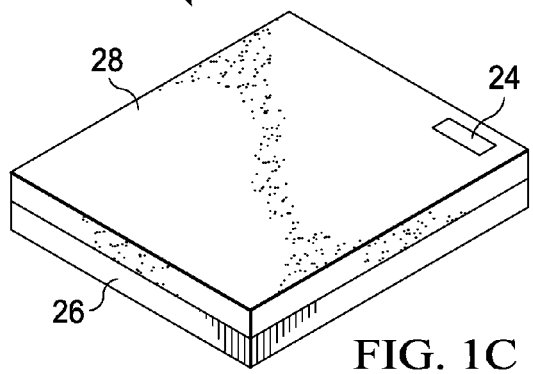
Figure 1D:
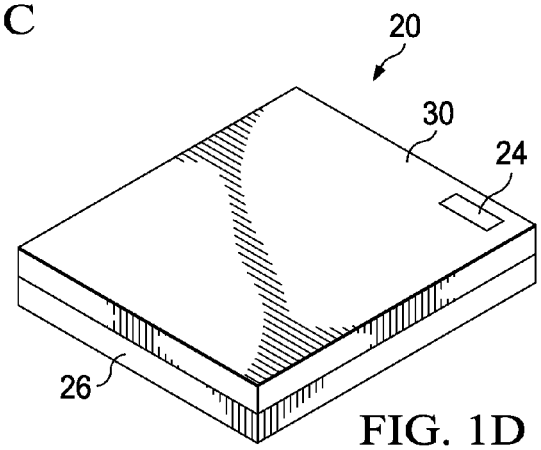

FIG. 1C illustrates an embodiment wherein molding compound 28 covers device die 22 and the top surface of package component 26. In these embodiments, package ID 24 is marked on molding compound 28. In these embodiments, if device die 22 is exposed, package ID 24 may also be marked on the top surface of device die 22 also. In yet alternative embodiments, as shown in FIG. 1D, the topmost component 30 of package 20 includes a heat sink. Accordingly, package ID 24 may be marked on heat sink 30. In FIGS. 1C and 1D, device dies still exist in packages 20, although they are not visible.

Package IDs 24 are unique, which means that no two package IDs are the same as each other. On the other hand, wafer IDs may also be unique, which means that no two wafers are identical to each other. In alternative embodiments, wafers may have same IDs, The wafers with the same IDs, however, can still be uniquely identified, for example, through the combination of the wafer ID and the respective manufacturing time, the respective product ID, etc.

Figure 2:
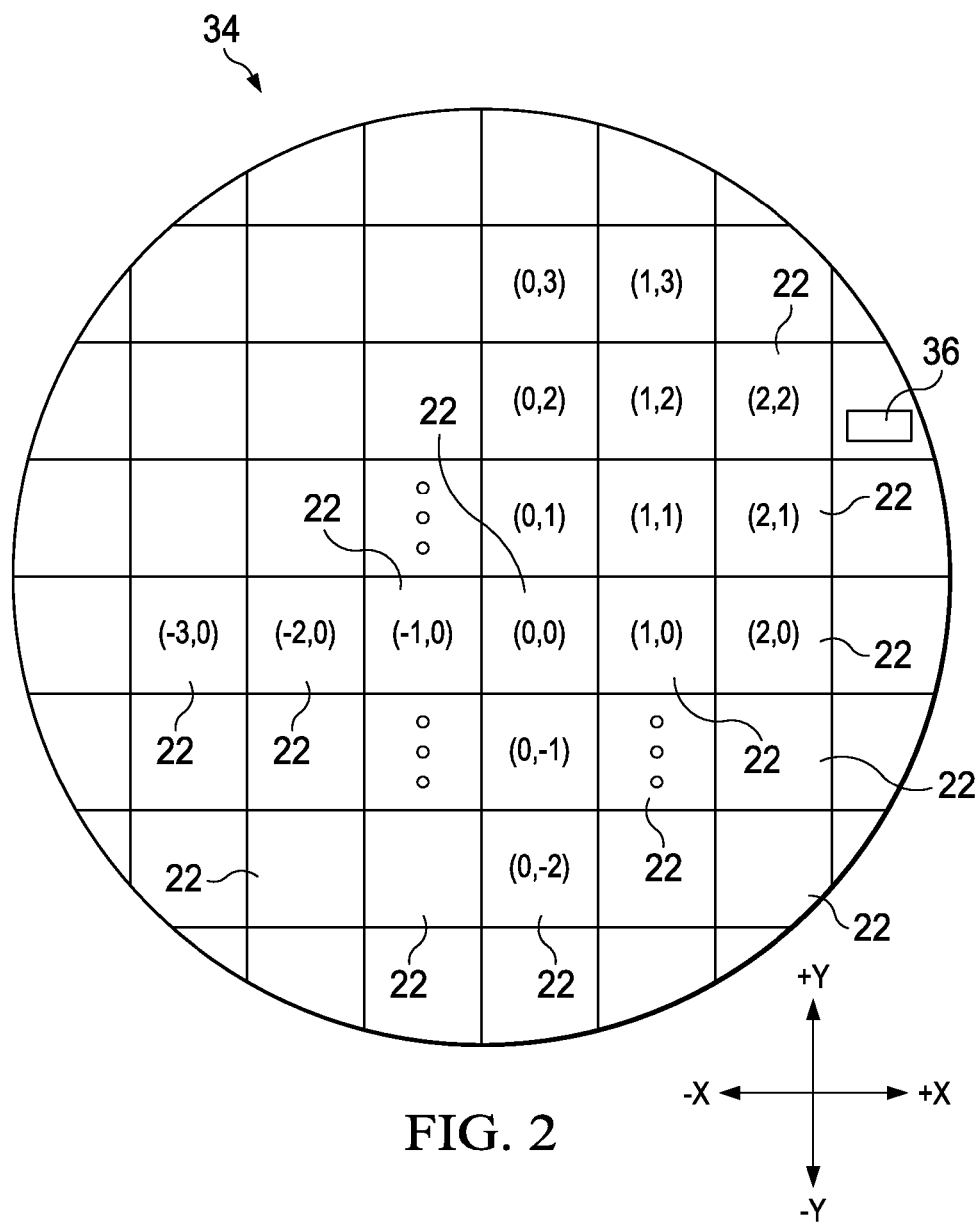
FIG. 2 illustrates a top view of a wafer and device dies in the wafer.

FIG. 2 illustrates a top view of wafer 34, which includes a plurality of device dies 22 therein. Wafer 34 may include wafer ID 36, which may be marked on the top surface or the back surface of wafer 34. Wafer ID 36 may be marked in wafer edge regions. For example, in FIG. 2, wafer ID 36 is marked on the top surface of a partial die. Each of device dies 22 may be identified through its location information in wafer 34, which location information is referred to as a location ID hereinafter. For example, in FIG. 2, X, −X, Y, and −Y directions are marked, which may be used for marking row number and column numbers, and the row numbers (Y value) and column number (X value) in combination may be used as location ID. In these exemplary embodiments, one of the dies may be designated as being the origin die that has the position (0, 0), meaning its X position (column number) is 0, and the Y position (row number) is 0, indicating it is the $0^{th}$ die in the X direction and the $0^{th}$ die in the Y direction. The location IDs of other dies are hence determined based on the origin die. For example, the location IDs of other dies include (1, 0), (2, 0), (3, 0), (0, 1), (0, 2), (−1, 0), (−1, 2), and the like. The respective location IDs are also shown in subsequently provided Tables 1 and 2 as X and Y values as examples. The location IDs may be recorded in computers and not recorded on wafers, and hence are virtual IDs, although they can also be mark on wafers.

Device dies 22 are cut from wafer 34 and packaged in packages 20 (FIGS. 1A through 1D). Throughout the description, the wafer from which a device die is cut from is referred to as an original wafer of the respective device die, and the wafer ID of the original wafer is referred to as an original wafer ID of the device die. The location ID of the device die on its original wafer 34 is referred to as the location ID of the respective device die. Hence, a wafer ID and a location ID in combination may be used to uniquely identify where the device die came from.

Figure 5:
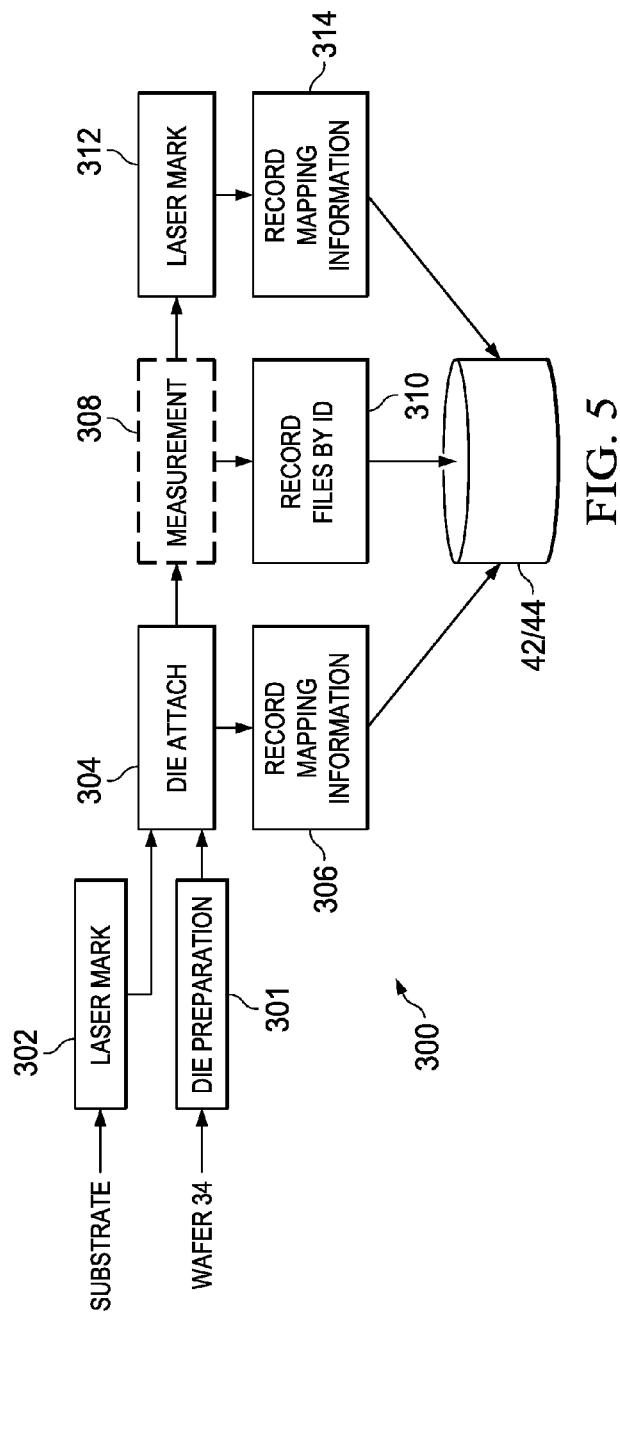

FIGS. 3, 4, and 5 illustrate the exemplary process flows for recording the original wafer ID and the location IDs of device dies for future tracing. The details of the process flows are discussed in subsequent paragraphs referring to FIGS. 3, 4, and 5.

FIGS. 6 through 9 schematically illustrate the formation of wafer 34, the sawing of wafer 34 into device dies 22, and the bonding of device dies 22 to interposer 22', and the bonding of interposer 22' to package substrate 26. The respective process flow is also shown as process flow 100 in FIG. 3.

Figure 6:
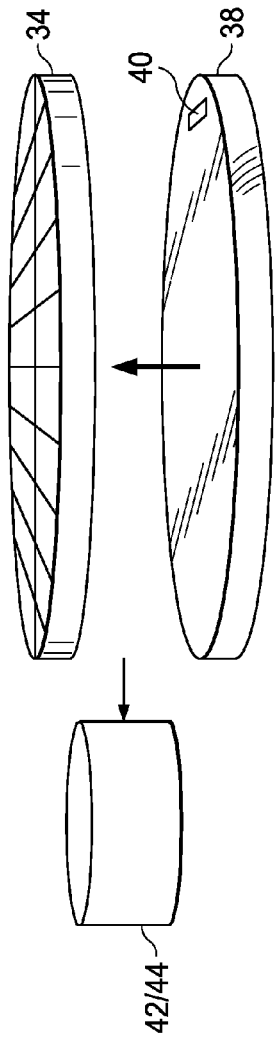
FIGS. 6 through 9 illustrate some processes for bonding device dies onto interposers and package substrates, and the recording of the respective mapping information.
Figure 7A:
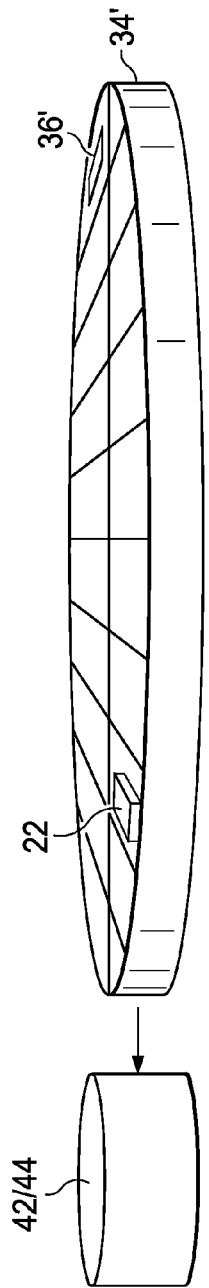
Figure 8:
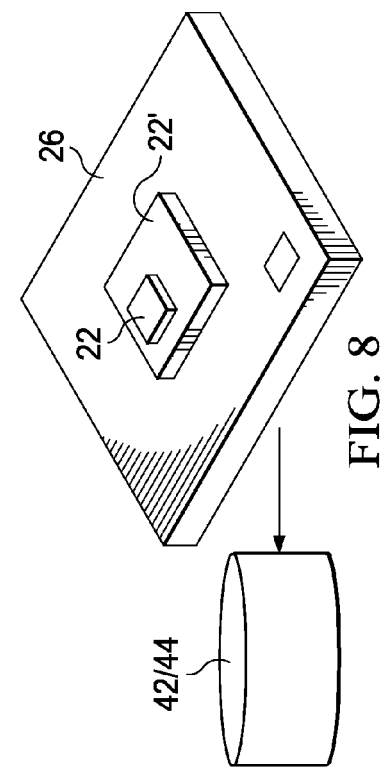
Figure 7B:
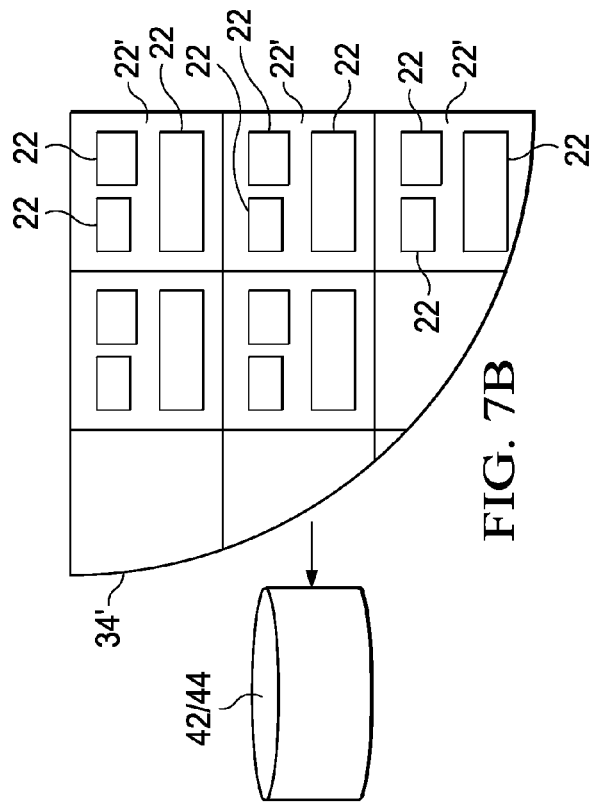
Figure 9:
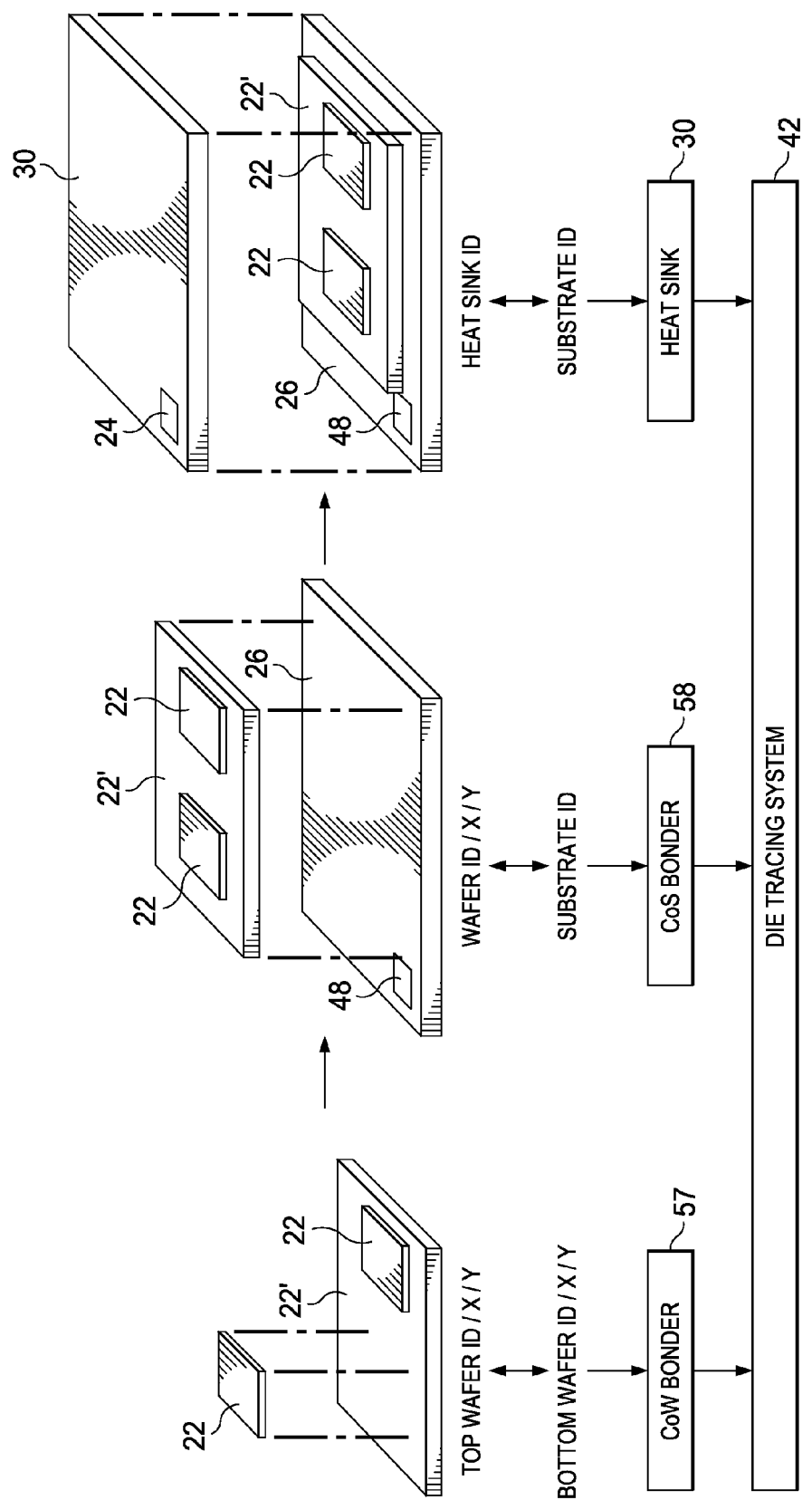

FIG. 9 illustrates a figure illustrating briefly the steps in FIGS. 6 through 8 and a subsequent heat sink mounting step. The details of FIG. 9 are discussed referring to FIGS. 6 and 8. As shown in FIG. 9, dies 22 are first bonded onto die 22' to form die stack 22/22', wherein die 22' may belong to a bottom wafer. The bonding is performed through Chip-on-Wafer (CoW) bonder 57. The wafer ID and the location ID of dies 22 are mapped to the wafer ID of the bottom wafer (not shown) comprising die 22', and possibly mapped to the location ID of die 22'. The respective step is also shown in FIGS. 7A, 7B, and 8. The mapping is recorded in die-tracing system 42.

Next, also referring to FIG. 9, die stack 22/22' is bonded to package substrate 26, which may include package substrate ID 48. The bonding is performed through Chip-On-Substrate (CoS) bonder 58. The wafer ID and the location ID of dies 22 are mapped to the substrate ID 48 of package substrate 26. The respective step is also shown in FIGS. 7A and 7B. The mapping is recorded in die-tracing system 42.

Next, the bonded die stack 22/22' and package substrate 26 are attached with heat sink 30. In some embodiments, the heat sink may be marked with an ID, which may be, or may not be, used as the final package ID. The mapping of the heat sink ID to the substrate ID may also be recorded in die-tracing system 42.

The detailed process steps shown in FIG. 9 are described below referring to FIGS. 6 through 8. Referring to FIG. 6, wafer 34 is bonded to glass carrier 38 (step 102 in FIG. 3), so that glass carrier 38 may provide mechanical support to wafer 34, and hence some processes may be performed on wafer 34. For example, the processes that can be performed on wafer 34 include forming Through-Substrate Vias (TSV, sometimes referred to as through-silicon vias, not shown). The formation of the TSVs includes thinning wafer 34, and forming redistribution lines (not shown) connected to the TSVs. In the formation of wafer 34, wafer ID 36 (FIG. 2) may be invisible. For example, wafer ID 36 may face carrier 38, and hence is no longer visible. Hence, carrier ID 40 may be marked on carrier 38 in order to identify wafer 34. The mapping of wafer ID 36 to carrier ID 40 is recorded (step 104 in FIG. 3) in die-tracing system 42. The mapping may include a row of a table, which row includes both wafer ID 36 and carrier ID 40 linked to each other.

In some embodiments, wafer 34 may also be mounted on a frame (step 106 in FIG. 3). In which case, if wafer ID 36 of wafer 34 is not visible, the frame may also be labeled with an ID (step 108 in FIG. 3), which is mapped to wafer ID 36. The mapping is recorded in die tracing system 42 (step 108 in FIG. 3).

Next, wafer 34 may be de-bonded from carrier 38 (and the frame, if used), and device dies 22 are sawed from wafer 34. Device dies 22 may then be bonded to bottom wafer 34' (FIGS. 7A and 7B, step 110 in FIG. 3), which includes bottom wafer ID 36'. Each of device dies 22 is bonded to one of device dies 22' in bottom wafer 34'. FIG. 7B schematically illustrates a top view of the bonding of a plurality of device dies 22 onto bottom wafer 34'. The respective perspective view of the same step is shown in FIG. 7A. In some embodiments, bottom device dies 22' are interposers that do not include active devices such as transistors therein. In alternative embodiments, bottom device dies 22' are also device dies that include active devices. Each of device dies 22' may also be identified by its wafer ID 36' and its location IDs (X' and Y'). The mapping of each of device dies 22 and the respective bonding die 22' is recorded in die-tracing system 42 (step 112 in FIG. 3). For example, in die-tracing system 42, a row of a table is created, wherein each of device dies 22 corresponds to a table row, which includes the wafer ID of the respective wafer 34, the location ID of the respective device die 22, the wafer ID 36' of the bottom wafer, and the location ID (X' and Y') of the respective die 22'.

In some embodiments, each of bottom die 22' may be bonded with a plurality of device dies 22, as shown in FIG. 7B. In these embodiments, the mapping of each of device dies 22 to the respective bonding bottom die 22' is recorded in die-tracing system 42. Hence, from the wafer ID and the location ID of 22', the wafer ID and the location ID of the respective bonding die 22 may be found through the mapping. Conversely, from the wafer ID and the location ID of die 22, the wafer ID and the location ID of the respective bonding die 22' may also be found through the mapping. Furthermore, since there may be more than one die 22 on the same die 22', the location ID of dies 22 on die 22' may also be recorded for identifying the specific dies 22. The device dies 22 that are bonded to the same die 22' may be identical to each other or different from each other in accordance with various embodiments.

Next, die stack 22/22' is bonded to package substrate 26, as shown in FIG. 8. Process 200 or 300, as shown in FIG. 4 or 5, illustrates the respective bonding step.

FIG. 4 illustrates process flow 200 for bonding a device die, which may be device die 22 or die 22 or die stack 22/22', onto a discrete package substrate. Referring to FIG. 4, die preparation step 201 is performed. In some embodiments, step 201 includes the process flow 100 (FIG. 3) for forming die stack 22/22'. In alternative embodiments, the bonding of dies 22 and 22' is skipped, and dies 22 are used directly after sawed from the respective wafer. Package substrate 26 is also prepared. In some embodiments, package substrate 26 includes substrate ID 48 (FIG. 9), which is marked on package substrate 26 through laser marking (step 202 in FIG. 4). Next, die 22 or die stack 22/22' is bonded (step 204 in FIG. 4) to package substrate 26, as also shown in FIGS. 8 and 9. The mapping between the wafer ID and the location ID of die 22 or die stack 22/22' to package substrate ID 48 is also recorded in die-tracing system 42 (step 206).

Referring back to FIG. 4, in some embodiments, after die attach, some measurements (step 208 in FIG. 4) may need to be performed on the resulting package. The measurement may include X-ray, dimension measurement, ultrasonic inspections, visual inspections, or the like. The results of the measurement may be recorded in a file or through protocols such as Semi Equipment Communications Standard (SECS) and Generic Equipment Model (GEM), which file or model is linked/mapped (step 210 in FIG. 4) to either the wafer ID and location ID of die 22 or die stack 22/22', or substrate ID 48 (FIG. 9). Accordingly, if the file indicates any problem, the respective die 22 or die stack 22/22', on which the measurement is performed, can be traced to find out the wafer ID and the location of the respective die 22 or die stack 22/22'.

If a heat sink (30 in FIG. 1D) needs to be mounted as a top part of package 20, a marking step (step 212 in FIG. 4), which step may be performed through laser marking, label printing, inkjet printing, or the like, is performed to mark heat sink 30 with package ID 24 (FIG. 1D). Heat sink 30 is then mounted as a top part of package 20. The package ID 24 on heat sink 30 is mapped to the wafer ID and the location ID of the respective die 22 (or die stack 22/22'), substrate ID 48 (FIG. 9), etc., and the respective mapping is recorded in die-tracing system 42.

Figure 10:
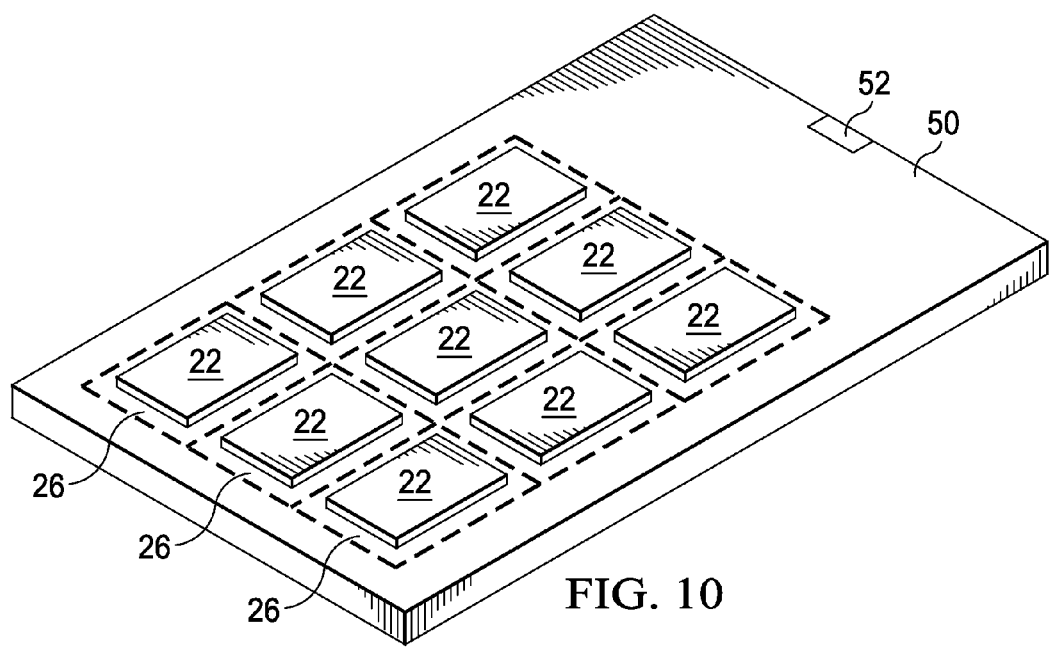
FIG. 10 illustrates the bonding of device dies onto a package substrate strip, and the recording of the respective mapping information.

FIG. 5 illustrates process flow 300 for bonding device die 22 or device die stack 22/22' on un-sawed package substrates that are in a package substrate strip. A respective step is shown in FIG. 10, which shows that dies 22 (or die stack 22/22) are bonded on package substrates 26, which belong to package substrate strip 50. In the respective step, as shown in FIG. 5, a strip ID 52 (FIG. 10) is marked on package substrate strip 50. In these embodiments, the individual package substrates 26 in package substrate strip 50 may, or may not, be marked with substrate IDs. The marking of strip ID 52 is shown as step 302 in FIG. 5. Next, as also shown in FIG. 5, dies 22 or die stacks 22/22' are bonded to package substrates 26, as also shown in FIG. 10. The respective step is shown as step 304 in FIG. 5. The mapping of the wafer ID and location ID of dies 22/22' to the strip ID 52 and substrate location IDs, which substrate location IDs indicate the relative locations of package substrates 26 in strip 50, are also recorded (step 306 in FIG. 5). For example, in the illustrated example in FIG. 10, there are nine package substrates. In some embodiments, X and Y values, which may be the column number and row number, respectively, may be used to mark the locations of package substrates 26, wherein the locations may range from (0, 0) to (2, 2), which include nine possible locations.

Next, as shown in FIG. 5, a measurement may be performed (step 308 in FIG. 5) on the bonded structure, and the measurement results are saved in files or collected by a host through protocols such as SECS/GEM. The respective files/ models may be mapped to the IDs including package substrate strip ID, location IDs of package substrates 26 in package substrate strip, and/or the wafer ID and location ID of dies 22/22'. Steps 308 and 310 are similar to steps 208 and 210 in FIG. 4, and hence the details are not repeated herein.

In subsequent steps, the structure shown in FIG. 10 is sawed apart into individual packages, and package IDs 24 (FIGS. 1A through 1D) may be marked on each of the resulting structures, as shown as step 312 in FIG. 5. The package IDs 24 may be recorded in die-tracing system 42.

Figure 11:
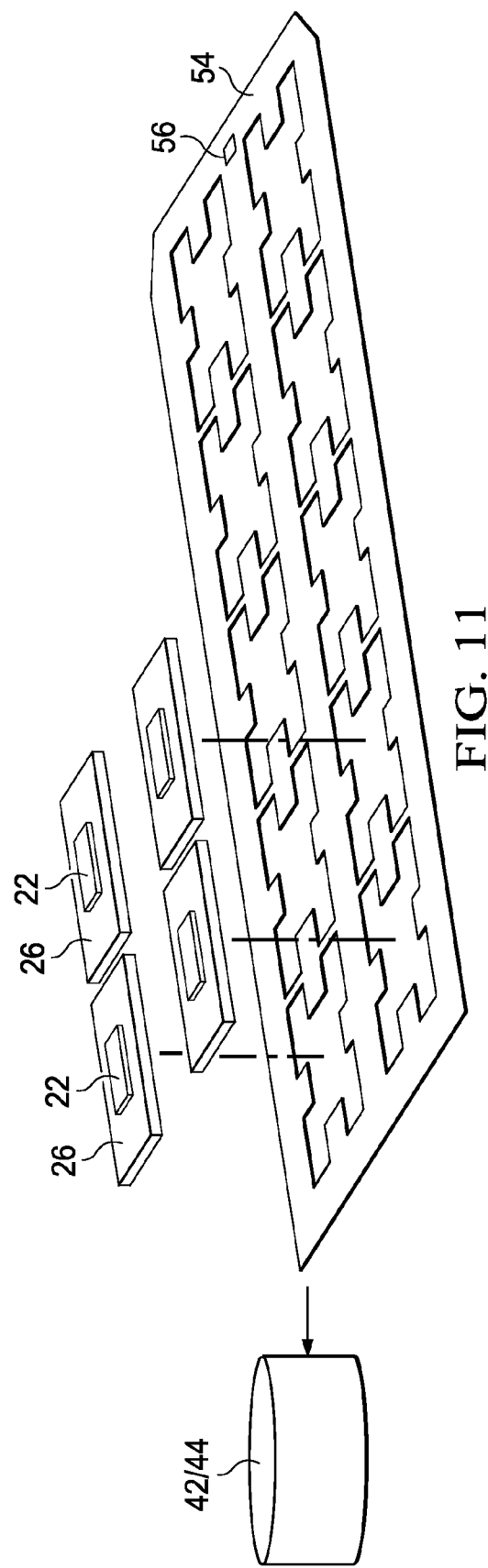
FIGS. 11 and 12 illustrate the placing of package substrates onto a boat, the picking and placing of device dies onto the package substrates, and the recording of the respective mapping information.

The integrated circuit manufacturing may go through a plurality of production steps, during which carriers are used to support and carry the manufactured wafers and dies. The carriers for carrying wafers and device dies may include IDs to help the recording of the die-tracing information. The carrier IDs may be temporarily recorded, although they may be kept in die-tracing system after the final packages are shipped to customer. In some embodiments, the carriers include boats, trays, glass carriers (FIG. 6, for example), jigs (for holding package substrate strips, for example), magazines, and the like. Each of the carriers may be marked with an ID at its surface. For example, FIG. 11 illustrates boat 54, which is marked with boat ID 56. Boat 54 includes a plurality of spaces, each configured to hold one of a plurality of package substrates 26. The boat ID 56 and the column number X and row number Y (location ID) of a position in boat 54 may be used to identify the position. Alternatively, each of the locations for holding package substrates is assigned with a sequence (seq) ID. Hence, the boat ID and the sequence ID may be combined to uniquely identify a position in boat 54.

Boat 54 may be used to carry package substrates 26 to go through a plurality of manufacturing steps including, for example, placing package substrates 26 in boat 54, picking and placing device dies 22 on package substrates 26, reflowing solder to bond dies 22 to package substrates 26, flux cleaning, underfilling, heat sink mounting (FIG. 9), and the like. When a device die is placed onto one of package substrates 26 in boat 54, the wafer ID and location ID of the device die 22 is mapped to the boat ID and the respective location ID in boat 54. Accordingly, when the packages are removed from boat 54, the package IDs of the packages are mapped to the wafer IDs and the location IDs of the respective device dies in the packages, which mapping is recorded in die-tracing system 42 (FIG. 14) for each of device dies 22.

Table 1 illustrates an exemplary mapping recorded in database 44 of die-tracing system 42 (FIG. 14).

TABLE 1

| Package ID | Boat ID | Die Seq in Boat | Wafer ID | X Value (Location ID) | Y value (Location ID) |
|---|---|---|---|---|---|
| QWSF0123 | 0135 | 01 | N9U123.01 | 28 | 31 |
| QWSF0124 | 0135 | 02 | N9U123.01 | 28 | 32 |
| QWSF0125 | 0135 | 03 | N9U123.01 | 29 | 1 |
| QWSF0126 | 0135 | 04 | N9U123.01 | 29 | 3 |

As shown in Table 1, each of the final packages ID is mapped to the wafer ID and the location ID (X and Y values) of the respective device die in the package. Furthermore, the boat ID is also recorded. It is noted that this boat ID also represents the IDs of other types of carriers that may be used in the packaging of the device dies. Hence, the boat ID may also be other types of IDs such as glass carrier IDs, tray IDs, jig IDs, or the like.

In some embodiments, the carriers that are used in packaging may not be marked with an ID. In these embodiments, a virtual ID may be used to identify the carriers. The virtual ID are recorded in database 44 (FIG. 14), and are used to record where each of the device dies are placed in the manufacturing process. For example, in a production line, there may be a plurality of lots, each including a plurality of carriers (such as boats 54 in FIG. 11). Each lot has its own lot ID, and each of boats in a lot has its sequence number. Accordingly, by identifying the lot ID and the sequence number, a carrier can be identified. The lot ID and the sequence number of the boat in combination may be used as the virtual ID for mapping the wafer IDs and the location IDs of the respective device dies in the boat. An example of the virtual IDs is shown in Table 2.

TABLE 2

| Package ID | Lot ID | Boat Seq Number | Die Seq in Boat | Wafer ID | X Value (Location ID) | Y value (Location ID) |
|---|---|---|---|---|---|---|
| QWSF0123 | 02 | 01 | 01 | N9U123.01 | 28 | 31 |
| QWSF0124 | 02 | 01 | 02 | N9U123.01 | 28 | 32 |
| QWSF0125 | 02 | 01 | 03 | N9U123.01 | 29 | 1 |
| QWSF0126 | 02 | 01 | 04 | N9U123.01 | 29 | 3 |

Table 2 is similar to Table 1 except that Lot ID and Boat Seq number in combination act as the virtual ID of the boat.

Figure 12:
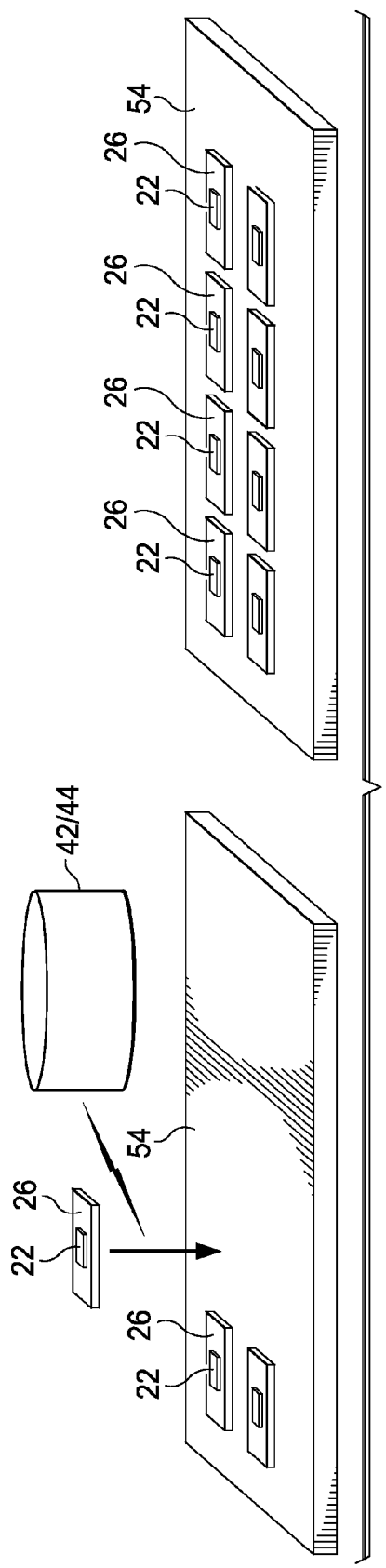

The carrier ID needs to be recorded each time the device dies, die stacks, die/substrate stacks or the like, are placed on the carrier. For example, FIG. 12 illustrates the placing of die/substrate stacks on boat 54, wherein the die/substrate stacks include device dies 22 bonded to substrates 26. The mapping of the device dies 22 (their wafer IDs and location ID) to the boat ID and the location IDs in boat 54 are recorded in die-tracing system 42. The mapping of substrate IDs of substrates 26 to device dies 22 and/or boat ID and locations IDs of in boat may also be recorded.

Figure 13:
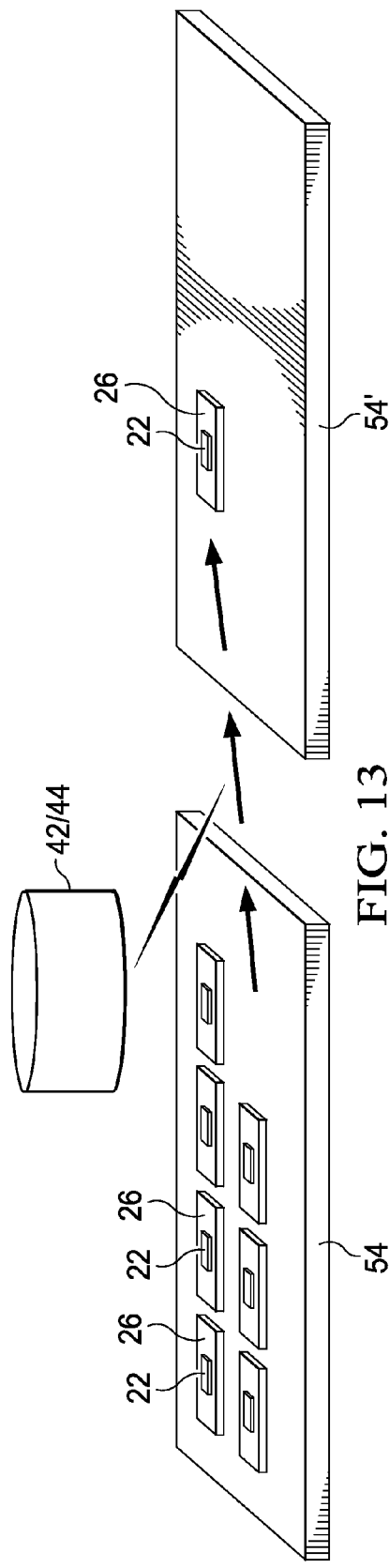
FIG. 13 illustrates the transferring of device dies from one carrier to another, and the recording of the respective mapping information.

FIG. 13 illustrates another embodiment, in which the die/substrate stacks (or dies only) are transferred from boat 54 to boat 54' (or other types of carriers). In these embodiments, the mapping of the device dies 22 (their wafer IDs and location IDs) (and sometimes substrate IDs of substrates 26) to the boat ID and the location IDs of the die/substrate stacks in boat 54' is also recorded in die-tracing system 42.

Throughout the embodiments of the embodiments, the wafer IDs and the location ID of device dies are recorded, and hence can be traced. When the final package ID is marked on packages, the package IDs are also mapped to the wafer IDs and the location IDs of device dies therein. For example, as shown in Tables 1 and 2, each of the package IDs is mapped to the wafer IDs and location IDs of device dies. Hence, whenever failure occurs in a package, through the package ID, which is unique, the wafer ID and the location ID of the device die in the package may be found from die-tracing system 42. These may help identify and find the root source of the problems. For example, through the wafer ID, the manufacturing tool that processed the problematic wafer and caused the problem may be identified and fixed. Also, since the locations of the problematic dies are found, the manufacturing process may be tuned to improve the within-wafer-uniformity.

In accordance with some embodiments, a method includes recording a wafer ID and a location ID of a device die in a database, and bonding the device die over a package substrate, wherein the device die and the package substrate are disposed in a package. A package ID is on the package. A mapping is established to link the wafer ID and the location ID of the device die to the package ID.

In accordance with other embodiments, a method includes locating a package ID from a package, wherein the package comprises a device die therein, and entering the package ID into a computer to find a wafer ID and a location ID of the device die. The location ID includes information of a location of the device die in the wafer.

In accordance with yet other embodiments, a method includes sawing a wafer into plurality of device dies, recording a wafer ID and a location ID for each of the plurality of device dies into a database, placing a package substrate onto a boat, and placing a device die on the package substrate. The device die is comprised in the plurality of device dies. A mapping is established to link the wafer ID and the location ID of the device die to a boat ID of the boat and a position of the device die on the boat. A reflow is performed to bond the device die onto the package substrate, wherein the device die and the package substrate are comprised in a package. The method further includes marking a unique package ID onto an exposed surface of the package, and recording a mapping linking the unique package ID to the wafer ID and the location ID of the device die.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   recording a carrier ID of a carrier;
   recording a wafer identification (ID) and a location ID of a device die in a database;
   mapping the carrier ID to the wafer ID and the location ID of the device die;
   placing a package substrate over the carrier, with the carrier being a boat or a glass carrier, wherein the boat is configured to go through a reflow process with the package substrate in the boat;
   placing the device die over the package substrate;

bonding the device die over a package substrate by performing a flow, wherein the device die and the package substrate are disposed in a package;
mounting a heat sink over the device die;
marking both a device die ID and a package ID on the device die; and
establishing a mapping to link the wafer ID and the location ID of the device die to the package ID.

2. The method of claim 1 further comprising marking a package substrate ID on the package substrate.

3. The method of claim 1, wherein the carrier ID is marked on the carrier.

4. The method of claim 1, wherein the carrier ID is a virtual ID comprising a lot ID and a sequence ID of the carrier, and wherein the carrier ID is recorded in a computer, and wherein the sequence ID is not marked on the carrier, and the method further comprises mapping a combination of the lot ID and the sequence ID to a wafer ID and a location ID of the device die.

5. The method of claim 1, wherein the carrier is the boat.

6. The method of claim 1, wherein the carrier is the glass carrier.

7. A method comprising:
forming a package comprising:
placing a package substrate over a boat;
recording a boat identification (ID) of the boat;
mapping the boat ID to a wafer ID of a wafer and a location ID of a device die in the wafer;
placing the device die over the package substrate; and
performing a reflow to bond the device die to the package substrate, wherein when the reflow is performed, the package substrate and the device die are in the boat, and wherein during the reflow, solder regions bonding the device die to the package substrate are reflowed;
locating a package ID from the package; and
entering the package ID into a computer to find the wafer ID and the location ID of the device die.

8. The method of claim 7 further comprising:
establishing a mapping linking the wafer ID and the location ID of the device die to the package ID; and
marking the package ID on a surface of the package.

9. The method of claim 7 further comprising:
bonding the device die onto an interposer die in an interposer wafer; and
establishing a mapping linking the wafer ID and the location ID of the device die to an additional wafer ID and an additional location ID of the interposer die, wherein the additional location ID comprises a row number and a column number of the interposer die in the interposer wafer.

10. The method of claim 7, wherein the boat ID is marked on the boat.

11. The method of claim 7, wherein the boat ID is a virtual ID comprising a lot ID and a sequence ID of the boat, wherein the boat ID is record in a computer, and wherein the sequence ID is not marked on the boat.

12. A method comprising:
sawing a wafer into plurality of device dies;
recording a wafer identification (ID) and a location ID for each of the plurality of device dies into a database;
placing a package substrate onto a boat;
placing a device die on the package substrate, wherein the device die is comprised in the plurality of device dies;
establishing a mapping linking the wafer ID and the location ID of the device die to a boat ID of the boat and a position of the device die on the boat;
performing a reflow to bond the device die onto the package substrate, wherein the device die and the package substrate are comprised in a package, and wherein when the reflow is performed, the package substrate and the device die are in the boat, and solder regions bonding the device die to the package substrate are reflowed;
marking a unique package ID onto an exposed surface of the package; and
recording a mapping linking the unique package ID to the wafer ID and the location ID of the device die.

13. The method of claim 12 further comprising:
locating a package ID from the package; and
entering the package ID into a computer to find from the database the wafer ID and the location ID.

14. The method of claim 12, wherein the boat ID is marked on the boat.

15. The method of claim 12, wherein the boat ID is a virtual ID comprising a lot ID and a sequence ID of the boat, wherein the boat ID is record in a computer, and wherein the sequence ID is not marked on the boat.

16. The method of claim 12, wherein the marking the unique package ID comprises marking the unique package ID on the device die, with the device die being exposed at a surface of the package.

17. The method of claim 12, wherein the marking the unique package ID comprises marking the unique package ID on the package substrate, with the package substrate being exposed at a surface of the package.

18. The method of claim 12 further comprising mounting a heat sink over the device die, wherein the marking the unique package ID comprises marking the unique package ID on the heat sink, with the heat sink being exposed at a surface of the package.

19. The method of claim 12 further comprising establishing a mapping linking the wafer ID and the location ID of the device die to the virtual ID comprising the lot ID and the sequence ID of the boat.

20. The method of claim 12 further comprising marking the wafer ID on the wafer.

* * * * *